United States Patent
Jeon et al.

(10) Patent No.: US 9,048,163 B2
(45) Date of Patent: Jun. 2, 2015

(54) TRANSISTOR, ELECTRONIC DEVICE INCLUDING TRANSISTOR, AND MANUFACTURING METHODS THEREOF

(75) Inventors: Sang-hun Jeon, Seoul (KR); I-hun Song, Seongnam-si (KR); Seung-eon Ahn, Hwaseong-si (KR); Chang-jung Kim, Yongin-si (KR); Young Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 470 days.

(21) Appl. No.: 13/404,136

(22) Filed: Feb. 24, 2012

(65) Prior Publication Data
US 2013/0009145 A1    Jan. 10, 2013

(30) Foreign Application Priority Data
Jul. 4, 2011    (KR) .......................... 10-2011-0066130

(51) Int. Cl.
*H01L 29/12* (2006.01)
*H01L 27/146* (2006.01)

(52) U.S. Cl.
CPC .... *H01L 27/14692* (2013.01); *H01L 27/14612* (2013.01)

(58) Field of Classification Search
USPC .......................................................... 257/43
See application file for complete search history.

(56) References Cited

U.S. PATENT DOCUMENTS

| | | | |
|---|---|---|---|
| 8,288,759 B2 * | 10/2012 | Chen et al. | 257/24 |
| 2003/0199117 A1 | 10/2003 | Kwon | |
| 2010/0006849 A1 * | 1/2010 | Jeon et al. | 257/66 |
| 2010/0059746 A1 * | 3/2010 | Itai | 257/43 |
| 2011/0254102 A1 * | 10/2011 | Xiao et al. | 257/369 |

FOREIGN PATENT DOCUMENTS

| | | |
|---|---|---|
| JP | 06104434 A | 4/1994 |
| JP | 2002026372 A | 1/2002 |
| KR | 100643038 B1 | 3/2002 |
| KR | 100560347 B1 | 10/2003 |
| KR | 20050015581 A | 2/2005 |

* cited by examiner

*Primary Examiner* — Matthew W Such
*Assistant Examiner* — Ali Naraghi
(74) *Attorney, Agent, or Firm* — Harness, Dickey & Pierce, P.L.C.

(57) ABSTRACT

A transistor may include an active layer having a plurality of oxide semiconductor layers and an insulating layer disposed therebetween. The insulating layer may include a material that has higher etch selectivity with respect to at least one of the plurality of oxide semiconductor layers. The electronic device may include a first transistor and a second transistor connected to the first transistor. The second transistor may include an active layer having a different structure from that of the active layer included in the first transistor. The active layer of the second transistor may have the same structure as one of the plurality of oxide semiconductor layers constituting the active layer of the first transistor.

45 Claims, 15 Drawing Sheets

TRANSISTOR, ELECTRONIC DEVICE INCLUDING TRANSISTOR, AND MANUFACTURING METHODS THEREOF

CROSS-REFERENCE TO RELATED APPLICATIONS

This application claims the benefit of Korean Patent Application No. 10-2011-0066130, filed on Jul. 4, 2011, in the Korean Intellectual Property Office, the disclosure of which is incorporated herein in its entirety by reference.

BACKGROUND

1. Field

Some example embodiments relate to transistors, electronic devices including the transistors, and manufacturing methods thereof.

2. Description of the Related Art

Transistors have been widely used for various purposes in various electronic devices. For example, a transistor is used as a switching device, a driving device, a photo-sensing device, or the like, and may be used as a component of various electronic circuits.

The characteristics of a transistor may be changed according to a material and structure of a channel layer. In other words, the material, the structure, or the like of the channel layer may be important factors for determining the characteristics of the transistor. Recently, in order to improve operating characteristics of the transistor, a method of using an oxide semiconductor layer with higher carrier mobility as a channel layer has been attempted.

However, since a transistor, e.g., an oxide transistor, including an oxide semiconductor layer as a channel layer has relatively low photosensitivity, using the transistor in an optical device (e.g., a photo sensor) may be difficult.

SUMMARY

Some example embodiments provide transistors that include a plurality of oxide semiconductor layers and/or electronic devices including the transistors. Some example embodiments provide electronic devices including a plurality of the transistors having different active structures. Some example embodiments provide methods of manufacturing the transistors and the electronic devices. The transistors are relatively easy to manufacture, and have improved photosensing characteristics.

Additional aspects will be set forth in part in the description which follows and, in part, will be apparent from the description, or may be learned by practice of example embodiments.

According to an example embodiment, a transistor includes an active layer including a first oxide semiconductor layer, a second oxide semiconductor layer, and an insulating layer disposed between the first and second oxide semiconductor layers, a source contacting one end of the active layer and a drain contacting another end of the active layer, a gate corresponding to the active layer, and a gate insulating layer disposed between the active layer and the gate.

The insulating layer may include a material that has an etch selectivity with respect to at least one of the first and second oxide semiconductor layers that is equal to or greater than about '2'. The insulating layer may include silicon, i.e., at least one from among silicon oxide, silicon oxynitride, and silicon nitride. The insulating layer may be a silicon oxide layer. The first oxide semiconductor layer, the insulating layer, and the second oxide semiconductor layer may be sequentially disposed on a surface of the gate.

The second oxide semiconductor layer may include a material that has higher photosensitivity than the first oxide semiconductor layer. The second oxide semiconductor layer may include a material that has a narrower energy band gap than the first oxide semiconductor layer.

The first oxide semiconductor layer may include at least one selected from a group consisting of MInZnO, MZnO, MAlO, and MSnO, where M may denote a metal element. The metal element (M) may be one of gallium (Ga), hafnium (Hf), titanium (Ti), tantalum (Ta), zirconium (Zr), and lanthanide (Ln). The first oxide semiconductor layer may be one of a GaInZnO layer and a HfInZnO layer.

The second oxide semiconductor layer may include at least one selected from a group consisting of InZnO, InO, and ZnO. The second oxide semiconductor layer may be an InZnO layer.

The transistor may further include an etch stop layer on the active layer. The active layer may be disposed on the gate. The gate may be disposed on the active layer.

According to another example embodiment, an electronic device includes the transistor.

According to another example embodiment, a photo-sensing circuit includes the transistor. The transistor may be a photo sensor transistor. The photo-sensing circuit may further include a switching transistor connected to the photo sensor transistor. The switching transistor may include an active layer having a single-layered structure. The active layer of the switching transistor may be formed of a material that is the same as the first oxide semiconductor layer of the photo sensor transistor.

According to another example embodiment, an electronic device includes the photo-sensing circuit.

According to another example embodiment, an electronic device includes a first transistor including a first active layer, a first gate, a first source, and a first drain, and a second transistor connected to the first transistor. The first active layer includes a first oxide semiconductor layer, a second oxide semiconductor layer, and an insulating layer therebetween. The second transistor includes a second active layer, a second gate, a second source, and a second drain. The second active layer has a different structure from that of the first active layer.

The insulating layer may include silicon, i.e., at least one of silicon oxide, silicon oxynitride, and silicon nitride. The second oxide semiconductor layer may include a material that has higher photosensitivity than the first oxide semiconductor layer.

The first oxide semiconductor layer may include at least one selected from a group consisting of MInZnO, MZnO, MAlO, and MSnO, where M is one of gallium (Ga), hafnium (Hf), titanium (Ti), tantalum (Ta), zirconium (Zr), and lanthanide (Ln). The second oxide semiconductor layer may include at least one selected from a group consisting of InZnO, InO, and ZnO. The second active layer may have a single-layered structure. The second active layer may be formed of a material that is the same as the first oxide semiconductor layer.

The first and second transistors may constitute a photosensing circuit. The first transistor may be a photo sensor transistor, and the second transistor may be a switching transistor.

According to another example embodiment, a method of manufacturing an electronic device includes forming a first gate and a second gate on a substrate, forming a gate insulating layer covering the first and second gates, sequentially forming a first oxide semiconductor layer, an insulating layer, and a second oxide semiconductor layer on the gate insulating layer, forming a first mask layer on the second oxide semiconductor layer on the first gate, etching the second oxide semiconductor layer and the insulating layer using the first mask layer to define a first active region including the first oxide semiconductor layer, the insulating layer, and the second oxide semiconductor layer on the first gate, and a second active region including the first oxide semiconductor layer on the second gate, removing the first mask layer, forming a first source and a first drain contacting the first active region, and forming a second source and a second drain contacting the second active region.

The insulating layer may include a material that has an etch selectivity with respect to the first oxide semiconductor layer which is equal to or greater than about '2'. The insulating layer may include silicon, i.e., at least one of silicon oxide, silicon oxynitride, and silicon nitride. The second oxide semiconductor layer may include a material that has higher photosensitivity than the first oxide semiconductor layer.

The first oxide semiconductor layer may include at least one selected from a group consisting of MInZnO, MZnO, MAlO, and MSnO, where M may be one of gallium (Ga), hafnium (Hf), titanium (Ti), tantalum (Ta), zirconium (Zr), and lanthanide (Ln). The second oxide semiconductor layer may include at least one selected from a group consisting of InZnO, InO, and ZnO. The method may further include forming a first etch stop layer on the first active region and a second etch stop layer on the second active region.

Forming the first source and the first drain contacting the first active region, and the second source and the second drain contacting the second active region may include forming an electrode layer covering the first and second etch stop layers, forming a second mask pattern on the electrode layer, etching the electrode layer and the first oxide semiconductor layer using the second mask pattern, and removing the second mask pattern. The first gate, the first active region, the first source, and the first drain may constitute a photo sensor transistor, and the second gate, the second active region, the second source, and the second drain may constitute a switching transistor.

According to another example embodiment, a method of manufacturing an electronic device includes forming a second oxide semiconductor layer and an insulating layer on a substrate, forming a first oxide semiconductor layer covering the second oxide semiconductor layer and the insulating layer, forming a first mask layer on portions of the first oxide semiconductor layer, etching the first oxide semiconductor layer using the first mask layer to form a first active layer including the second oxide semiconductor layer, the insulating layer and the first oxide semiconductor layer, and a second active layer apart from the first active layer, the second active layer including the first oxide semiconductor layer, removing the first mask layer, forming a first source contacting one end of the first active layer and a first drain contacting another end of the first active layer, and forming a second source contacting one end of the second active layer and a second drain contacting another end of the second active layer, forming a gate insulating layer covering exposed surfaces of the first and second active layers, the first source and drain, and the second source and drain, and forming a first gate and a second gate on the gate insulating layer, the first gate corresponding with the first active layer and the second gate corresponding with the second active layer, respectively.

The first gate, the first active region, the first source, and the first drain may constitute a photo sensor transistor, and the second gate, the second active region, the second source, and the second drain may constitute a switching transistor.

According to another example embodiment, an active layer for a transistor may include a first oxide semiconductor layer, a second oxide semiconductor layer, and an insulating layer disposed between the first and second oxide semiconductor layers. The insulating layer may include a material that has an etch selectivity with respect to at least one of the first and second oxide semiconductor layers that is equal to or greater than about '2'.

The insulating layer may include silicon. The first oxide semiconductor layer may be one of a GaInZnO layer and a HfInZnO layer. The second oxide semiconductor layer may include at least one selected from a group consisting of InZnO, InO, and ZnO.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
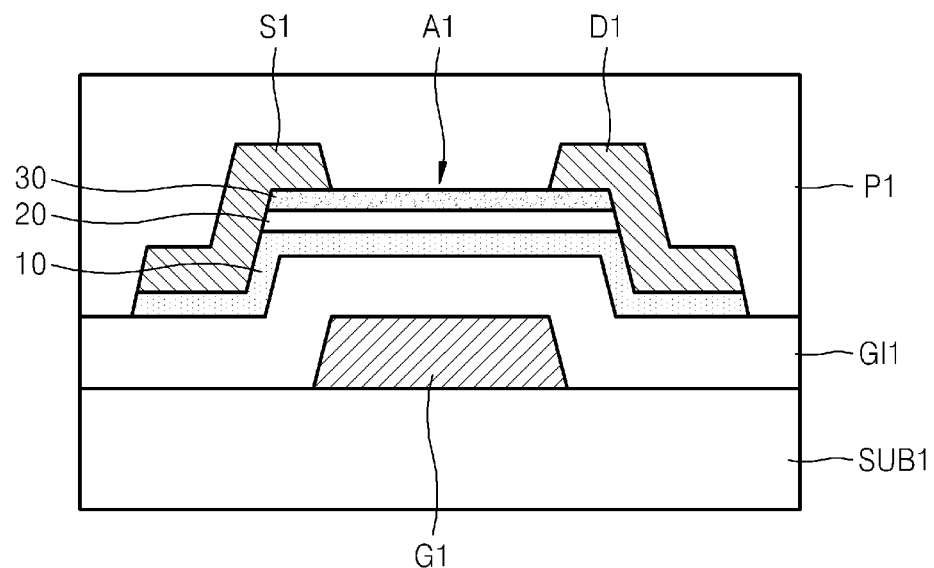
FIGS. 1 to 3 are cross-sectional views illustrating transistors according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description.

Hereinafter, transistors, electronic devices including the transistors, and manufacturing methods thereof according to various example embodiments are described in detail with reference to the accompanying drawings. In the drawings, the thickness of layers and regions may be exaggerated for clarity. Like reference numerals denote like elements throughout the drawings.

FIG. 1 is a cross-sectional view illustrating a transistor according to an example embodiment. In the example embodiment, the transistor is a bottom-gate type transistor, in which a gate G1 is disposed below an active layer A1.

Referring to FIG. 1, the gate G1 may be disposed on a substrate SUB1. The substrate SUB1 may be a glass substrate but may be any one of various substrates used in a general method of manufacturing a semiconductor device, for example, a plastic substrate, a silicon substrate, or the like. The gate G1 may be formed of a material generally used to form an electrode, e.g., a metal, a conductive oxide, or the like. For example, the gate G1 may be formed of metal, such as molybdenum (Mo), copper (Cu), titanium (Ti), aluminum (Al), nickel (Ni), tungsten (W), platinum (Pt), and chromium (Cr), a conductive oxide, such as indium zinc oxide (IZO) and indium tin oxide (ITO), or an alloy including at least two metals.

In addition, the gate G1 may have a single-layer structure, or a multi-layered structure including a plurality of different material layers. A gate insulating layer GI1 may be formed on the substrate SUB1 to cover the gate G1. The gate insulating layer GI1 may be a silicon oxide layer, a silicon oxynitride layer, or a silicon nitride layer. However, the inventive concepts are not limited thereto, and the gate insulating layer GI1 may be other material layers, for example, a high dielectric material layer with a higher dielectric constant than a silicon nitride layer. The gate insulating layer GI1 may have a stack structure including at least two layers from among a silicon oxide layer, a silicon oxynitride layer, a silicon nitride layer, and a high dielectric material layer.

The active layer A1 may be disposed on the gate insulating layer GI1. The active layer A1 may be disposed above the gate G1. The active layer A1 may include an oxide semiconductor and may have a multi-layered structure. For example, the active layer A1 may include a first oxide semiconductor layer 10, an insulating layer 20, and a second oxide semiconductor layer 30 that are sequentially stacked. The active layer A1 is described below in more detail.

A source electrode S1 and a drain electrode D1 may be disposed on the gate insulating layer GI1 to contact both ends, e.g., two upper edges, of the active layer A1, respectively. The source electrode S1 and the drain electrode D1 each may have a single-layered or multi-layered structure. The source electrode S1 and the drain electrode D1 may each be the same material layer as the gate G1, but may each be a different material layer from the gate G1. A passivation layer P1 may be disposed on the gate insulating layer GI1 to cover the active layer A1, the source electrode S1, and the drain electrode D1. The passivation layer P1 may be, for example, a silicon oxide layer, a silicon oxynitride layer, a silicon nitride layer, or an organic insulating layer, or may have a stack structure including at least two layers thereof.

The active layer A1 will now be described in more detail. In the active layer A1, the first oxide semiconductor layer 10 is disposed closer to the gate G1 than the second oxide semiconductor layer 30, and may function as a main channel layer. The first oxide semiconductor layer 10 may include a material (oxide semiconductor) with a greater energy band gap (wider energy band gap) than the second oxide semiconductor layer 30. Also, a carrier density of the first oxide semiconductor layer 10 may be lower than that of the second oxide semiconductor layer 30. The first oxide semiconductor layer 10 may increase a threshold voltage of the transistor. If the first oxide semiconductor layer 10 is not formed, the threshold voltage of the transistor may be excessively low.

The first oxide semiconductor layer 10 may be formed of, for example, at least one selected from among MInZnO, MZnO, MAlO, and MSnO. Here, 'M' may denote a metal element, and may be gallium (Ga), hafnium (Hf), titanium (Ti), tantalum (Ta), zirconium (Zr), or a lanthanide (Ln). Specifically, the first oxide semiconductor layer 10 may be a GaInZnO layer, a HfInZnO layer, or the like. The oxide semiconductor constituting the first oxide semiconductor layer 10 may be amorphous or crystalline, or may have a mixture structure of amorphous and crystalline phases.

A material of the first oxide semiconductor layer 10 is not limited to the above-described material, and may vary. A thickness of the first oxide semiconductor layer 10 may be, for example, about 10 nm to about 100 nm. However, an appropriate thickness of the first oxide semiconductor layer 10 may vary according to the material of the first oxide semiconductor layer 10.

The second oxide semiconductor layer 30 may have higher photosensitivity than the first oxide semiconductor layer 10. The sensitivity of a material to light, that is, photosensitivity, may be related to an energy band gap. As an energy band gap is reduced, photosensitivity may be increased. Thus, the second oxide semiconductor layer 30 may include a material with a smaller energy band gap (narrower energy band gap) than the first oxide semiconductor layer 10. Also, photosensitivity may be related to a carrier density. For example, the higher a carrier density of a material, the higher the photosensitivity thereof may be. Thus, the second oxide semiconductor layer 30 may include a material with a higher carrier density than the first oxide semiconductor layer 10.

The second oxide semiconductor layer 30 may be referred to as a 'photo-sensing layer'. The second oxide semiconductor layer 30 may include, for example, at least one selected from among InZnO, InO, and ZnO. Specifically, the second oxide semiconductor layer 30 may be an InZnO layer, an InO layer, or a ZnO layer. A material of the second oxide semiconductor layer 30 is not limited thereto, and may vary. A thickness of the second oxide semiconductor layer 30 may be, for example, about 10 nm to about 200 nm. An appropriate thickness of the second oxide semiconductor layer 30 may vary according to the material of the second oxide semiconductor layer 30.

The insulating layer 20 disposed between the first oxide semiconductor layer 10 and the second oxide semiconductor layer 30 may include a material having high etch selectivity with respect to at least one from among the first oxide semiconductor layer 10 and the second oxide semiconductor layer 30. For example, the etch selectivity of the insulating layer 20 with respect to the first oxide semiconductor layer 10 may be equal to or greater than about '2'. That is, the speed of etching the insulating layer 20 may be two times or more faster than the speed of etching the first oxide semiconductor layer 10.

The etch selectivity of the insulating layer 20 with respect to the first oxide semiconductor layer 10 may be about several tens or about several hundreds or more. That is, the speed of etching the insulating layer 20 may be several tens or several hundreds times more than the speed of etching the first oxide semiconductor layer 10. The insulating layer 20 may include, for example, at least one from among a silicon oxide, a silicon oxynitride, and a silicon nitride. Specifically, the insulating layer 20 may be a silicon oxide layer, a silicon oxynitride layer, or a silicon nitride layer. A thickness of the insulating layer 20 may be about 10 nm to about 200 nm, but is not limited thereto.

As described above, in the current embodiment, the active layer A1 including the first and second oxide semiconductor layers 10 and 30 may be used to not only appropriately control operating characteristics of the transistor, e.g., a threshold voltage thereof, but also increase the photosensitivity of the transistor. If the transistor according to the current embodiment is used, an electronic device, e.g., a photo-sensing device, which has improved operating and photo sensing characteristics may be manufactured.

The structure of the transistor illustrated in FIG. 1 may be modified in various ways. For example, the shape of the active layer A1 is not limited to as illustrated in FIG. 1 and the active layer A1 may have any of various other structures. Specifically, FIG. 1 illustrates that the first oxide semiconductor layer 10 extends to ends of the source electrode S1 and the drain electrode D1, but is not limited thereto. A modified example of the first oxide semiconductor layer 10 of FIG. 1 is illustrated in FIG. 2.

Figure 2:
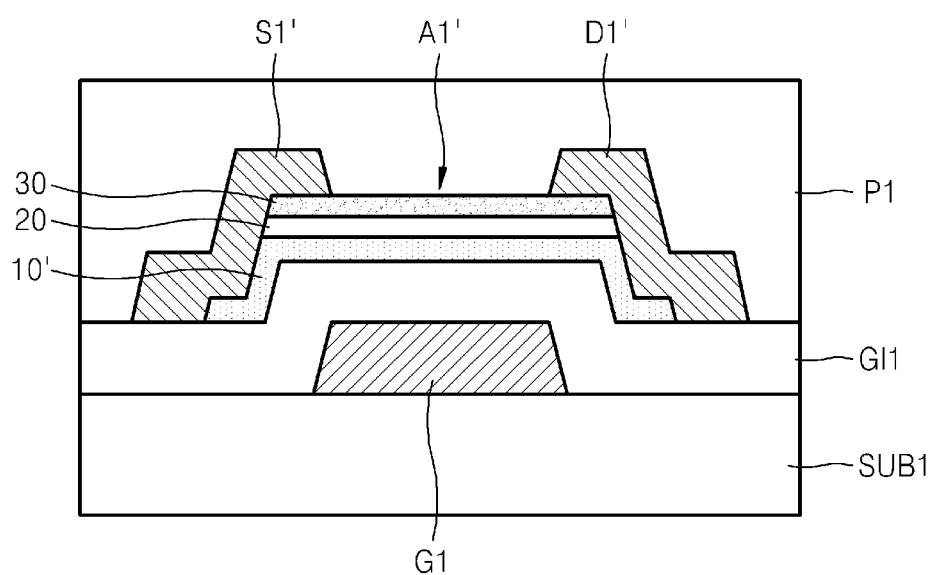

Referring to FIG. 2, in an active layer A1', both end portions of a first oxide semiconductor layer 10' may not extend to lower edges of a source electrode S1' and a drain electrode D1'. In this case, the source electrode S1' and the drain electrode D1' may completely cover both side surfaces of the first oxide semiconductor layer 10'. The structure of a transistor illustrated in FIG. 2 may be the same as that of the transistor of FIG. 1 except for the shapes of the first oxide semiconductor layer 10', the source electrode S1', and the drain electrode D1'.

Figure 3:
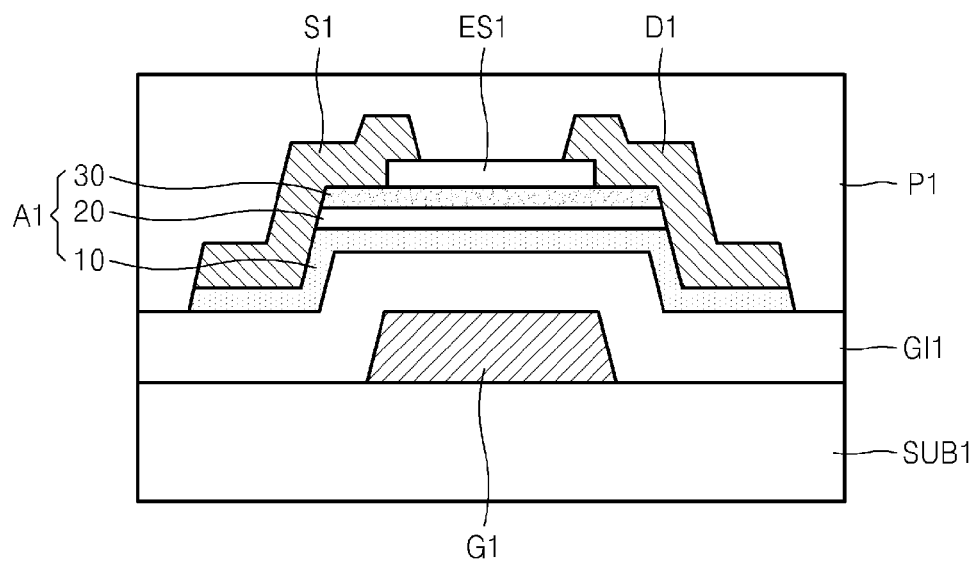

According to another example embodiment, the transistor of FIG. 1 may further include an etch stop layer on the active layer A1, as illustrated in FIG. 3. Referring to FIG. 3, an etch stop layer ES1 may be disposed on an active layer A1. A width of the etch stop layer ES1 may be narrower than that of the active layer A1. Both ends of the active layer A1 may not be covered with the etch stop layer ES1. A source electrode S1 may cover one end of the etch stop layer ES1 and one end of the active layer A1. A drain electrode D1 may cover the other end of the etch stop layer ES1 and the other end of the active layer A1.

The etch stop layer ES1 may prevent or reduce the active layer A1 from being damaged by etching during an etch process for forming the source electrode S1 and the drain electrode D1. The etch stop layer ES1 may include, for example, silicon oxide, silicon nitride, or an organic insulating material. The etch stop layer ES1 may be used based on the materials used to form the active layer A1, the source electrode S1, and the drain electrode D1. The structure of the transistor of FIG. 3 may be the same as that of the transistor of FIG. 1 except for the etch stop layer ES1.

Figure 4:
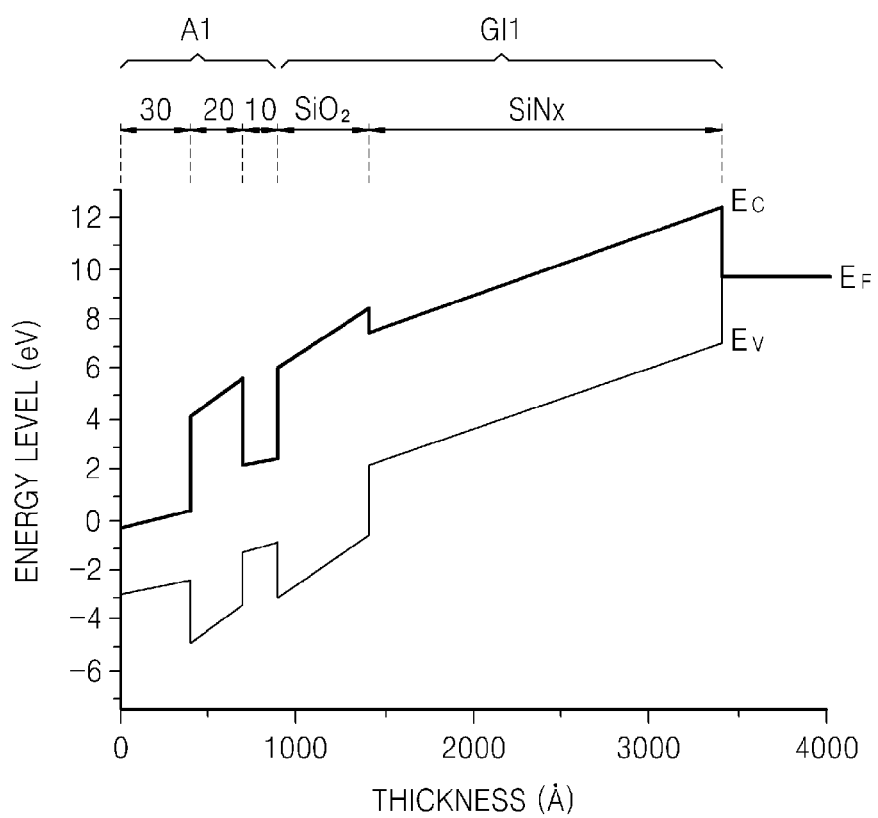
FIG. 4 is a graph illustrating an energy band diagram of an active layer and a gate insulating layer of a transistor according to an example embodiment.

FIG. 4 is a graph illustrating an energy band diagram of the active layer A1 and the gate insulating layer GI1 of the transistor of FIG. 1, according to an example embodiment. The first oxide semiconductor layer 10, the insulating layer 20, and the second oxide semiconductor layer 30 included in the active layer A1 are respectively a GaInZnO layer, a SiO$_2$ layer, and an InZnO layer. The gate insulating layer GI1 has a stack structure of a SiN$_x$ layer and a SiO$_2$ layer. In FIG. 4, reference numerals 'E$_C$' and 'E$_V$' respectively denote a lowest energy level of a conduction band and a highest energy level of a valence band. Reference numeral 'E$_F$' denotes the Fermi energy level of a gate.

Referring to FIG. 4, in the active layer A1, an energy band gap of the second oxide semiconductor layer 30 is somewhat smaller (narrower) than that of the first oxide semiconductor layer 10, and the insulating layer 20 having a greater (wider) energy band gap than those of the first and second oxide semiconductor layers 10 and 30 is sandwiched between the first and second oxide semiconductor layers 10 and 30.

A transistor according to an example embodiment may be applied to various types of electronic devices. For example, a transistor according to an example embodiment may be used as a photo sensor transistor of a photo-sensing circuit. In this case, the sensing performance, operating characteristics, and reliability of the photo-sensing circuit may be improved. The photo-sensing circuit may further include a switching device connected to the photo sensor transistor. The switching device may be, for example, a switching transistor.

A photo sensor array may be manufactured by arranging a plurality of unit circuits each including the photo sensor transistor and the switching transistor connected to the photo sensor transistor. The photo sensor array may be applied to a flat panel display device. If the photo sensor array is applied to a flat panel display device, the flat panel display device may be controlled from a remote location by using external light. A transistor according to an example embodiment may be used for various purposes in various types of electronic devices other than the photo-sensing circuit, the photo sensor array, and the flat panel display device.

Figure 5:
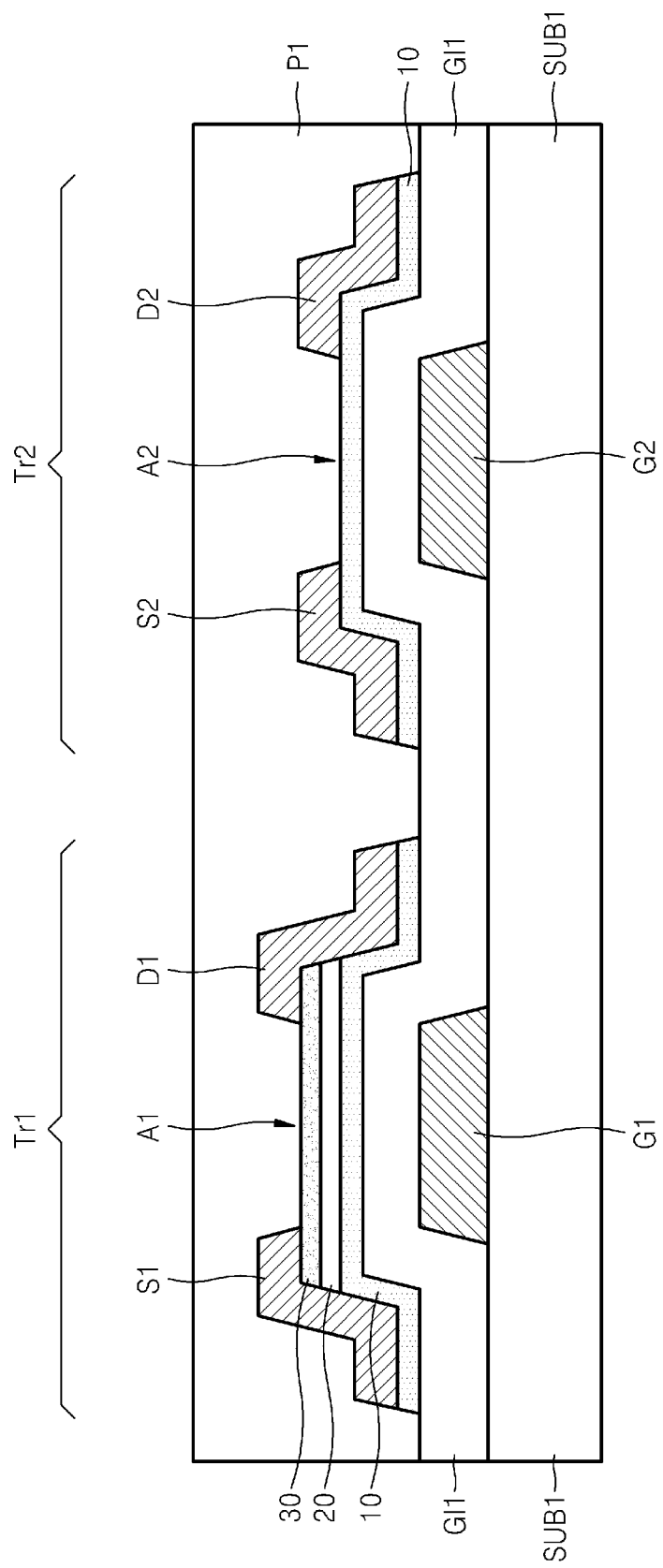
FIG. 5 is a cross-sectional view illustrating an electronic device (photo-sensing circuit) which includes a transistor, according to an example embodiment.

FIG. 5 is a cross-sectional view illustrating an electronic device (photo-sensing circuit) which includes a transistor, according to an example embodiment. Referring to FIG. 5, the electronic device (photo-sensing circuit) may include a photo sensor transistor Tr1 and a switching transistor Tr2. A structure of the photo sensor transistor Tr1 may be substantially the same as or similar to the transistor of FIG. 1. More specifically, the photo sensor transistor Tr1 may include a first gate G1, a gate insulating layer GI1, a first active layer A1, a first source electrode S1, and a first drain electrode D1. The first active layer A1 may include a first oxide semiconductor layer 10, an insulating layer 20, and a second oxide semiconductor layer 30.

The first gate G1, the gate insulating layer GI1, the first active layer A1, the first source electrode S1, and the first drain electrode D1 may be respectively the same as the gate G1, the gate insulating layer GI1, the active layer A1, the source electrode S1, and the drain electrode D1 illustrated in FIG. 1. The switching transistor Tr2 may have a different structure from that of the photo sensor transistor Tr1.

An active layer A2 of the switching transistor Tr2 (hereinafter referred to as a 'second active layer A2') may have a different structure from that of the first active layer A1 of the photo sensor transistor Tr1. For example, the second active layer A2 may have the same structure as the first oxide semiconductor layer 10 of the first active layer A1. If the first oxide semiconductor layer 10 has a single-layered structure, the second active layer A2 may also have a single-layered structure. If the first oxide semiconductor layer 10 has a multi-layered structure, the second active layer A2 may also have a multi-layered structure. Since the switching transistor Tr2 does not perform optical sensing but performs switching, the switching transistor Tr2 does not use a photo sensor layer, i.e., the second oxide semiconductor layer 30.

The characteristics of the switching transistor Tr2 are hardly affected by light. Materials and structures of a second gate G2, a second source electrode S2, and a second drain electrode D2 included in the switching transistor Tr2 may be substantially the same as those of the first gate G1, the first source electrode S1, and the first drain electrode D1 included in the photo sensor transistor Tr1. The gate insulating layer GI1 may be commonly used by the photo sensor transistor Tr1 and the switching transistor Tr2. A passivation layer P1 that covers the photo sensor transistor Tr1 and the switching transistor Tr2 may be substantially the same as the passivation layer P1 of FIG. 1.

Figure 6:
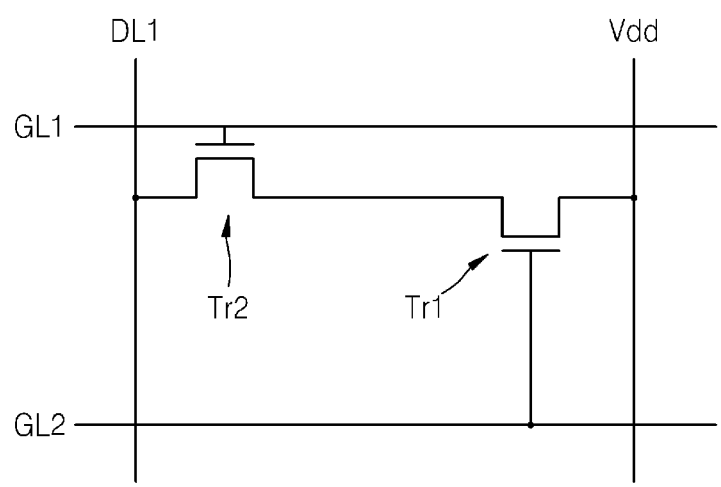
FIG. 6 is a circuit diagram of the electronic device (photo-sensing circuit) of FIG. 5.

FIG. 6 is a circuit diagram of the electronic device (photo-sensing circuit) of FIG. 5. In other words, FIG. 6 is a circuit diagram illustrating a structure of a unit circuit of a photo sensor array according to an example embodiment.

Referring to FIG. 6, a first gate line GL1 and a second gate line GL2 may be disposed in parallel with each other. Also, a data line DL1 and a power source line Vdd may be disposed in parallel to intersect the first gate line GL1 and the second gate line GL2. The unit circuit may include a photo sensor transistor Tr1 and a switching transistor Tr2 connected to the photo sensor transistor Tr1. Structures of the photo sensor transistor Tr1 and the switching transistor Tr2 may respectively be substantially the same as or similar to those of the photo sensor transistor Tr1 and the switching transistor Tr2 of FIG. 5.

The photo sensor transistor Tr1 may be connected between the second gate line GL2 and the power source line Vdd. The switching transistor Tr2 may be connected between the first gate line GL1 and the data line DL1. When a predetermined light is irradiated on the photo sensor transistor Tr1, the photo sensor transistor Tr1 may generate photocurrent. In this case, if the switching transistor Tr2 is turned on, data may be output through the photo sensor transistor Tr1 and the switching transistor Tr2. The circuit structure of the electronic device of FIG. 6 is illustrative and may be modified in various ways. Also, a photo sensor array may be manufactured by arranging a plurality of unit circuits, each as shown in FIG. 6. The photo sensor array may be used in a flat panel display device or the like.

Figure 7:
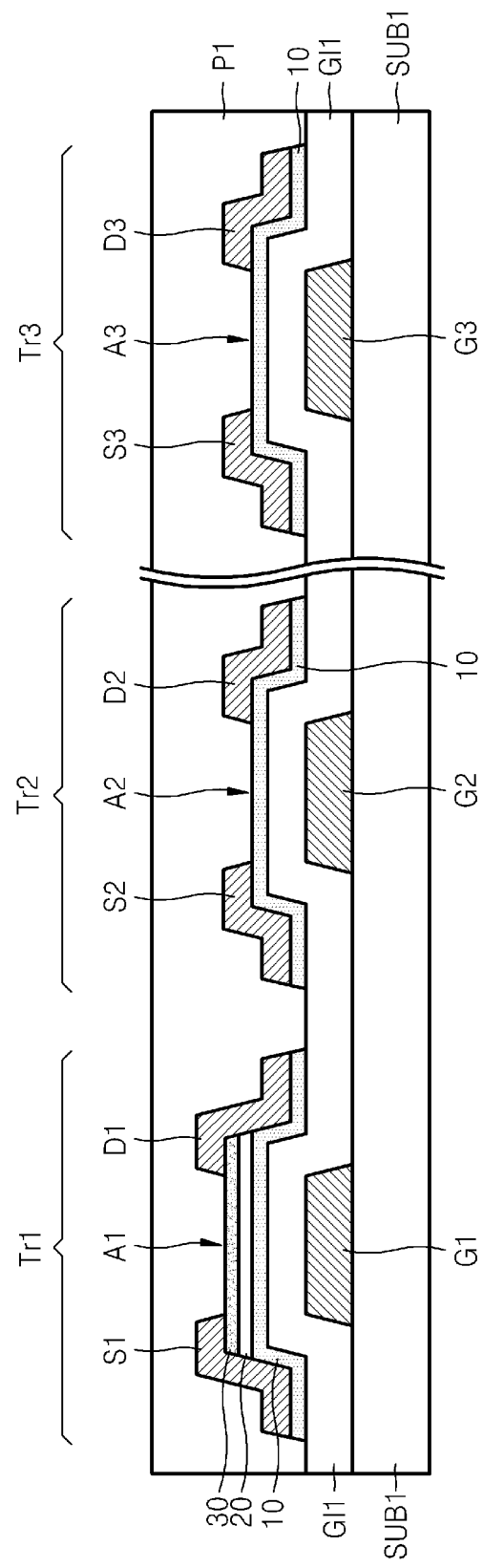
FIG. 7 is a cross-sectional view illustrating portions of an electronic device (flat panel display device) which includes a transistor, according to another example embodiment.

FIG. 7 is a cross-sectional view illustrating portions of an electronic device (flat panel display device) which includes a transistor, according to another example embodiment. Referring to FIG. 7, the electronic device (flat panel display device) may include a photo-sensing circuit and a switch Tr3 for display. The photo-sensing circuit may include a photo sensor transistor Tr1 and a switching transistor Tr2 as described above with reference to FIGS. 5 and 6. A structure of the switch Tr3 for display, which is disposed in a display region, may be substantially the same as or similar to that of the switching transistor Tr2. The switch Tr3 for display may include a third gate G3, a gate insulating layer GI1, a third active layer A3, a third source electrode S3, and a third drain electrode D3.

Materials and structures of the third gate G3, the gate insulating layer GI1, the third active layer A3, the third source electrode S3, and the third drain electrode D3 may be substantially the same as those of the second gate G2, the gate insulating layer GI1, the second active layer A2, the second source electrode S2, and the second drain electrode D2 included in the switching transistor Tr2. Since the switch Tr3 for display may have a structure that is substantially the same as or similar to that of the switching transistor Tr2 described above, an additional manufacture of the switch Tr3 for display may not be a burden in a manufacturing process. Although not shown, a pixel electrode may further be provided to be connected to the switch Tr3 for display. A structure of the display region would be apparent to those of ordinary skill in the art and will not be described here.

Figure 8:
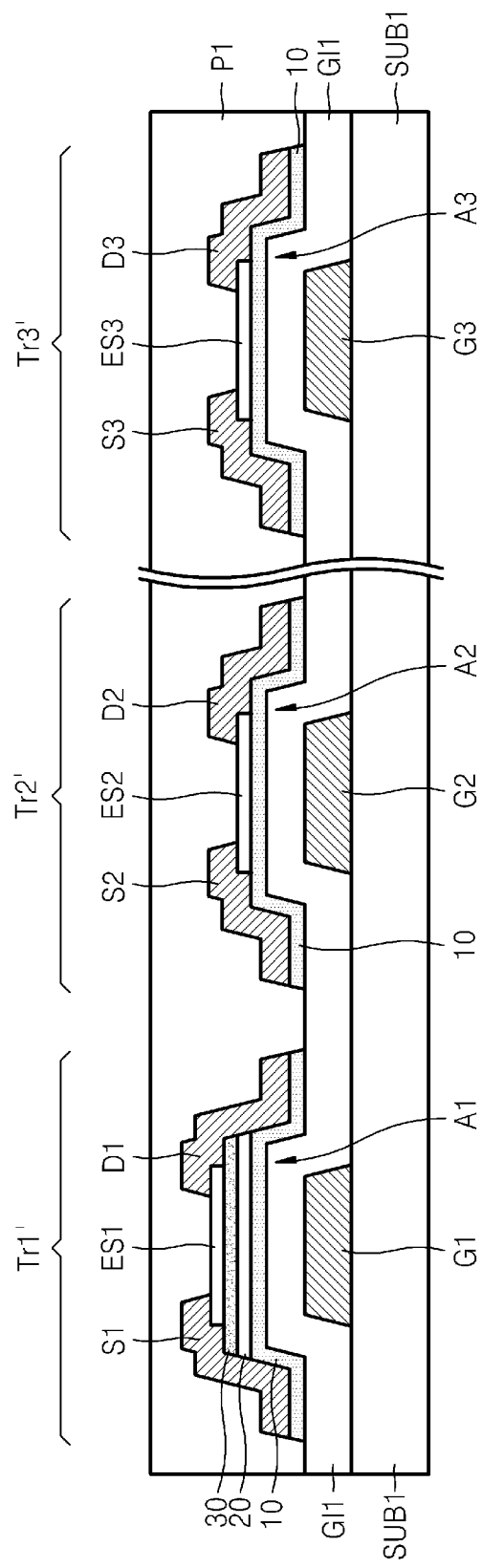
FIG. 8 is a cross-sectional view illustrating portions of an electronic device (flat panel display device) which includes a transistor, according to another example embodiment.

According to another example embodiment, an etch stop layer may be formed on the first to third active layers A1, A2, and A3 of FIG. 7. An example thereof is shown in FIG. 8. In FIG. 8, first to third etch stop layers ES1, ES2, and ES3 are respectively included in a photo sensor transistor Tr1', a switching transistor Tr2', and a switch Tr3' for display.

Figure 9A:
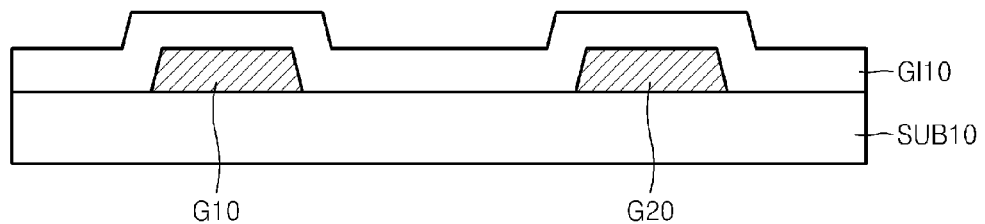
FIGS. 9A to 9H are cross-sectional views illustrating a method of manufacturing an electronic device (photo-sensing circuit) which includes a transistor, according to an example embodiment.

FIGS. 9A to 9H are cross-sectional views illustrating a method of manufacturing an electronic device (photo-sensing circuit) which includes a transistor, according to an example embodiment. Referring to FIG. 9A, a first gate G10 and a second gate G20 may be formed on portions of a substrate SUB10. The substrate SUB10 may be a glass substrate but may be any of other various substrates, e.g., a plastic substrate, a silicon substrate, or the like, which may be used in a general method of manufacturing a semiconductor device. The first and second gates G10 and G20 may be formed of any material generally used to form an electrode, e.g., metal and a conductive oxide. For example, the first and second gates G10 and G20 may be formed of metal, such as Mo, Cu, Ti, Al, Ni, W, Pt, or Cr; a conductive oxide, such as IZO or ITO; or an alloy including at least two metals.

Each of the first and second gates G10 and G20 may have either a single-layered structure or a multi-layered structure that includes a plurality of different material layers. A gate insulating layer GI10 may be formed on the substrate SUB10 to cover the first and second gates G10 and G20. The gate insulating layer GI1 may be a silicon oxide layer, a silicon oxynitride layer, or a silicon nitride layer, or may be another material layer, for example, a high dielectric material layer with a higher dielectric constant than a silicon nitride layer. The gate insulating layer GI1 may have a stack structure including at least two layers from among a silicon oxide layer, a silicon oxynitride layer, a silicon nitride layer, and a high dielectric material layer.

Figure 9B:
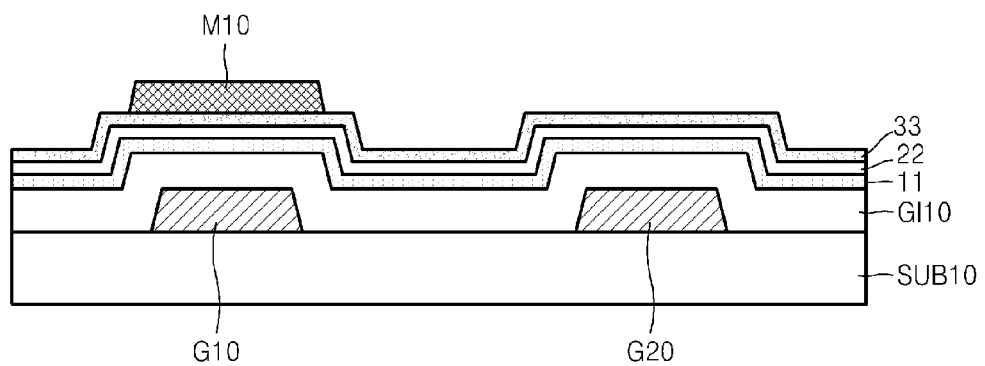

Referring to FIG. 9B, a first oxide semiconductor layer 11, an insulating layer 22, and a second oxide semiconductor layer 33 may be sequentially formed on the gate insulating layer GI10. Materials of the first oxide semiconductor layer 11, the insulating layer 22, and the second oxide semiconductor layer 33 may respectively correspond to those of the first oxide semiconductor layer 10, the insulating layer 20, and the second oxide semiconductor layer 30 illustrated in FIG. 1. In other words, the first oxide semiconductor layer 11 may include at least one selected from MInZnO, MZnO, MAlO, and MSnO. Here, 'M' may denote a metal element, and may be Ga, Hf, Ti, Ta, Zr, or Ln. Specifically, the first oxide semiconductor layer 11 may be a GaInZnO layer, a HfInZnO layer, or the like. The second oxide semiconductor layer 33 may include, for example, at least one from among InZnO, InO, and ZnO. Specifically, the second oxide semiconductor layer 30 may be an InZnO layer, an InO layer, a ZnO layer, or the like.

The insulating layer 22 may include a material having high etch selectivity with respect to at least one from among the first oxide semiconductor layer 11 and the second oxide semiconductor layer 33. For example, an etch selectivity of the insulating layer 22 with respect to the first oxide semiconductor layer 11 may be equal to or greater than about '2'. The etch selectivity denotes a ratio between etch speeds. When a certain etch gas is used, the speed of etching the insulating layer 22 may be two times or more faster than the speed of etching the first oxide semiconductor layer 11. The insulating layer 22 may include at least one of a silicon oxide, a silicon oxynitride, and a silicon nitride, for example.

If the insulating layer 22 is a silicon oxide layer, a silicon oxynitride layer, or a silicon nitride layer, the etch selectivity of the insulating layer 22 with respect to the first oxide semiconductor layer 11 may be about several tens to about several hundreds. Thicknesses of the first oxide semiconductor layer 11, the insulating layer 22, and the second oxide semiconductor layer 33 may be respectively about 10 nm to about 100 nm, about 10 nm to about 200 nm, and about 10 nm to about 200 nm but are not limited thereto. A first mask pattern M10 may be formed on a portion of the second oxide semiconductor layer 33 above the first gate G10. The first mask pattern M10 may be, for example, a photoresist layer.

Figure 9C:
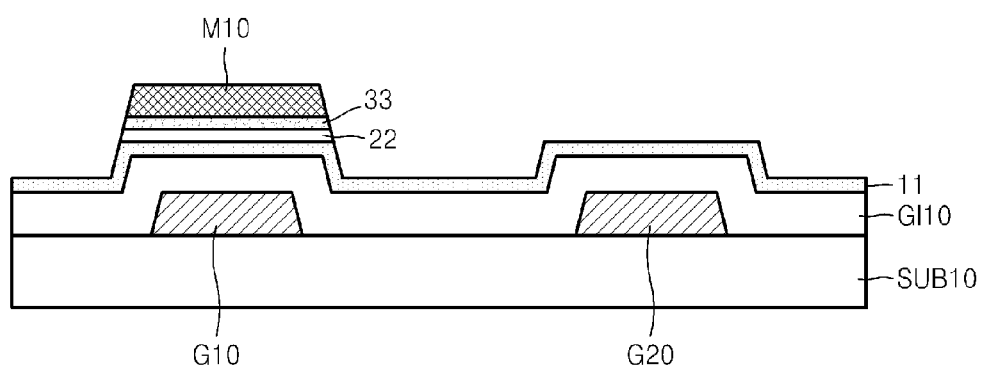

Referring to FIG. 9C, the second oxide semiconductor layer 33 and the insulating layer 22 may be sequentially etched using the first mask pattern M10 as an etch barrier. The insulating layer 22 may be etched, for example, by using an etch gas containing $CHF_3$. The etch gas may further contain $O_2$ and Ar. The etch gas used to etch the insulating layer 22 is an example and any of various other etch gases may be used. When the insulating layer 22 is etched, the first oxide semiconductor layer 11 may be used as an etch stop layer, since the etch selectivity of the first oxide semiconductor layer 11 with respect to the insulating layer 22 may be relatively low. Thus, the insulating layer 22 may be selectively etched while minimizing or reducing damage to the first oxide semiconductor layer 11.

If the insulating layer 22 is an oxide semiconductor layer (hereinafter referred to as an 'intermediate oxide semiconductor layer') similar to the first oxide semiconductor layer 11, the selective etching described above with reference to FIG. 9C may not be possible. That is, since there is no selective etching property between the first oxide semiconductor layer 11 and the intermediate oxide semiconductor layer (i.e., an etch selectivity between the first oxide semiconductor layer 11 and the intermediate oxide semiconductor layer is about '1'), the first oxide semiconductor layer 11 is highly likely to be damaged or removed when the intermediate oxide semiconductor layer is etched.

As described above, use of the intermediate oxide semiconductor layer instead of the insulating layer 22 may be unfavorable to a manufacturing process. However, according to the current embodiment, the insulating layer 22 having higher etch selectivity with respect to the first oxide semiconductor layer 11 is used to easily etch only the insulating layer 22 while minimizing or reducing damage to the first oxide semiconductor layer 11, as described above with reference to FIG. 9C. Accordingly, a transistor may be manufactured simply and device reproducibility and performance may be improved.

Figure 9D:
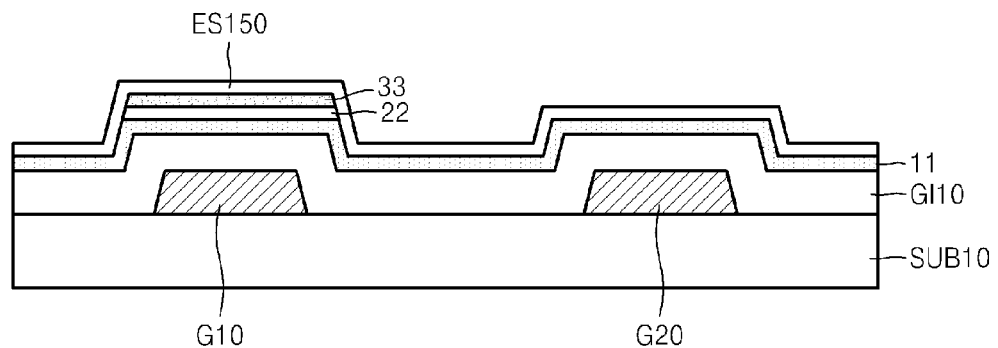

Referring to FIG. 9D, the first mask pattern M10 is removed, and an etch stop material layer ES150 may be formed to cover the first oxide semiconductor layer 11, the insulating layer 22, and the second oxide semiconductor layer 33. The etch stop material layer ES150 may be formed of, for example, a silicon oxide, a silicon nitride, an organic insulating material, or the like.

Figure 9E:
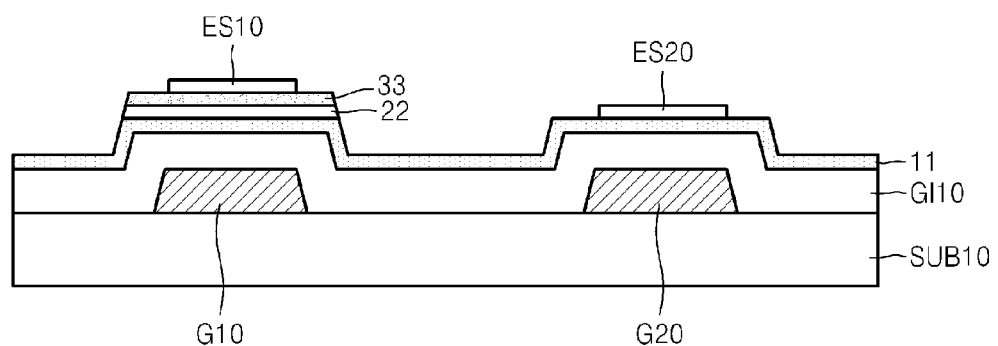

Then, the etch stop material layer ES150 may be patterned to form first and second etch stop layers ES10 and ES20, as illustrated in FIG. 9E. The first etch stop layer ES10 may be formed on the second oxide semiconductor layer 33 above the first gate G10, and the second etch stop layer ES20 may be formed on the first oxide semiconductor layer 11 above the second gate G20. The first and second etch stop layers ES10 and ES20 are optional in the method of the current embodiment.

Figure 9F:
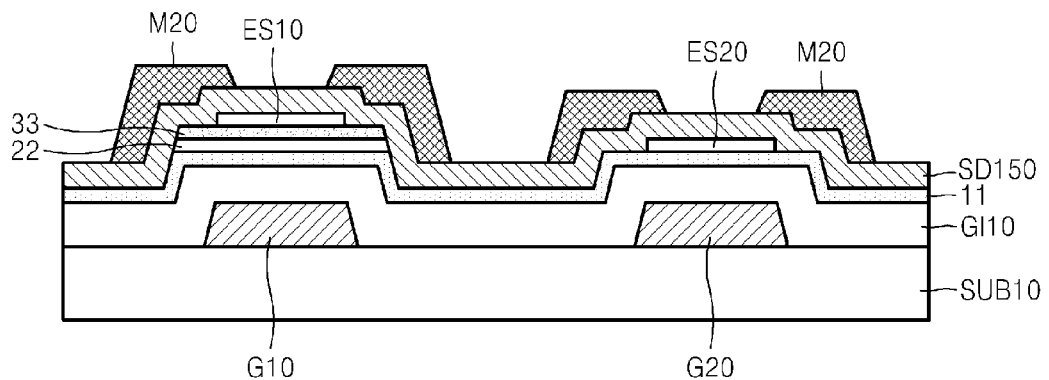

Referring to FIG. 9F, an electrode layer SD150 may be formed on the first and second oxide semiconductor layers 11 and 33 to cover the first and second etch stop layers ES10 and ES20. A second mask pattern M20 may be formed on the electrode layer SD150. The second mask pattern M20 may be formed of a photoresist material. The second mask pattern M20 may have a shape that defines a source/drain electrode to be formed from the electrode layer SD150.

The electrode layer SD150 may be etched using the second mask pattern M20 as an etch barrier, and the first oxide semiconductor layer 11 may then be etched. The resultant structure is illustrated in FIG. 9G.

Figure 9G:
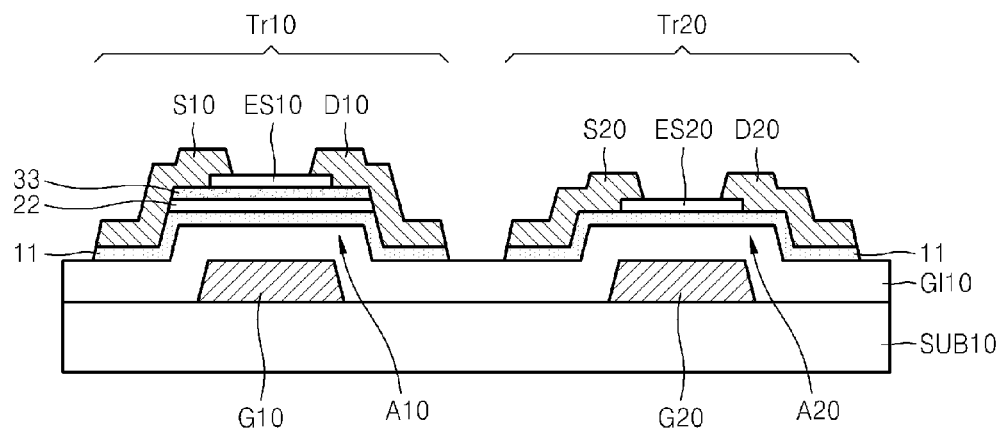

Referring to FIG. 9G, a first active layer A10, including the patterned first oxide semiconductor layer 11, insulating layer 22, and second oxide semiconductor layer 33, may be formed above the first gate G10. A first source electrode S10 and a first drain electrode D10 may be formed to contact both ends (upper edges) of the first active layer A10. A second active layer A20, including the patterned first oxide semiconductor layer 11, may be formed above the second gate G20. A second source electrode S20 and a second drain electrode D20 may be formed to contact both ends (upper edges) of the second active layer A20. The first gate G10, the gate insulating layer GI10, the first active layer A10, the first etch stop layer ES10, the first source electrode S10, and the first drain electrode D10 may constitute a first transistor Tr10. The second gate G20, the gate insulating layer GI10, the second active layer A20, the second etch stop layer ES20, the second source electrode S20, and the second drain electrode D20 may constitute a second transistor Tr20.

Figure 9H:
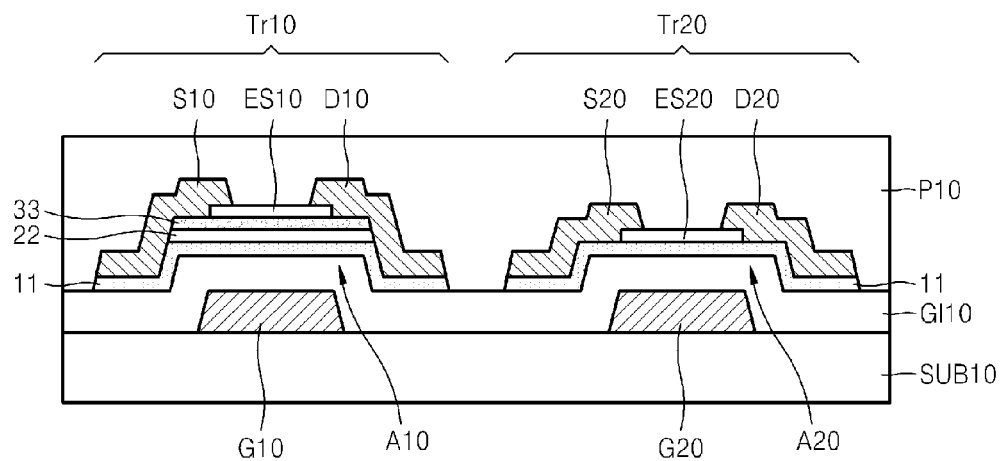

Referring to FIG. 9H, a passivation layer P10 may be formed on the substrate SUB10 to cover the first and second transistors Tr10 and Tr20. The passivation layer P10 may be, for example, a silicon oxide layer, a silicon oxynitride layer, a silicon nitride layer, an organic insulating layer, or a stack structure including at least two layers from among these layers. The first transistor Tr10 and the second transistor Tr20 may be annealed at a predetermined or given temperature. The resultant first transistor Tr10 and second transistor Tr20 may respectively correspond to the photo sensor transistor Tr1' and the switching transistor Tr2' of FIG. 8.

With the method illustrated in FIGS. 9A to 9H, an electronic device (photo-sensing circuit) including two different transistors may be easily manufactured according to a relatively simple process. In this method, a mask process may be used about four times. In other words, performing a first mask process to form the first and second gates G10 and G20 of FIG. 9A, performing a second mask process to form the first mask pattern M10 of FIG. 9B, performing a third mask process to form the first and second etch stop layers ES10 and ES20 of FIG. 9E, and performing a fourth mask process to form the second mask pattern M20 of FIG. 9F may be possible.

If an intermediate oxide semiconductor layer is used instead of the insulating layer 22, then in the operation of FIG. 9C, an etch selectivity between the first oxide semiconductor layer 11 and the intermediate oxide semiconductor layer is about '1' and the first oxide semiconductor layer 11 is more likely to be damaged or removed when the intermediate oxide semiconductor layer is etched. Thus, in order to prevent or inhibit the first oxide semiconductor layer 11 from being damaged or removed, a complicated process may be used and the number of times that a mask process is performed may increase. However, according to the current embodiment, the insulating layer 22 having higher etch selectivity with respect to the first oxide semiconductor layer 11 is used, thereby enabling an electronic device to be manufactured simply. Also, device reproducibility and performance may be improved.

An electronic device manufactured according to the method illustrated in FIGS. 9A to 9H may be, for example, a photo-sensing circuit. In this case, the first transistor Tr10 may be a photo sensor transistor and the second transistor Tr20 may be a switching transistor. A display unit may be formed together with the photo-sensing circuit. A switch of the display unit may have a structure that is substantially the same as that of the second transistor Tr20. Thus, an additional manufacture of the switch of the display unit may not be a burden in a manufacturing process. A flat panel display device including the photo-sensing circuit may be manufactured by further forming the display unit.

Various modifications may be made to the method illustrated in FIGS. 9A to 9H. For example, in the operation of FIG. 9E, the first oxide semiconductor layer 11 may be patterned to define or form a first active region and a second active region. The first active region may be similar to the first active layer A10 of FIG. 9G, and the second active region may be similar to the second active layer A20 of FIG. 9G. As such, after the first oxide semiconductor layer 11 is patterned to define or form the first and second active regions, the electrode layer SD150 and the second mask pattern M20 described above with reference to FIG. 9F may be formed. Also, the method of FIGS. 9A to 9H may be modified in various ways.

Figure 10:
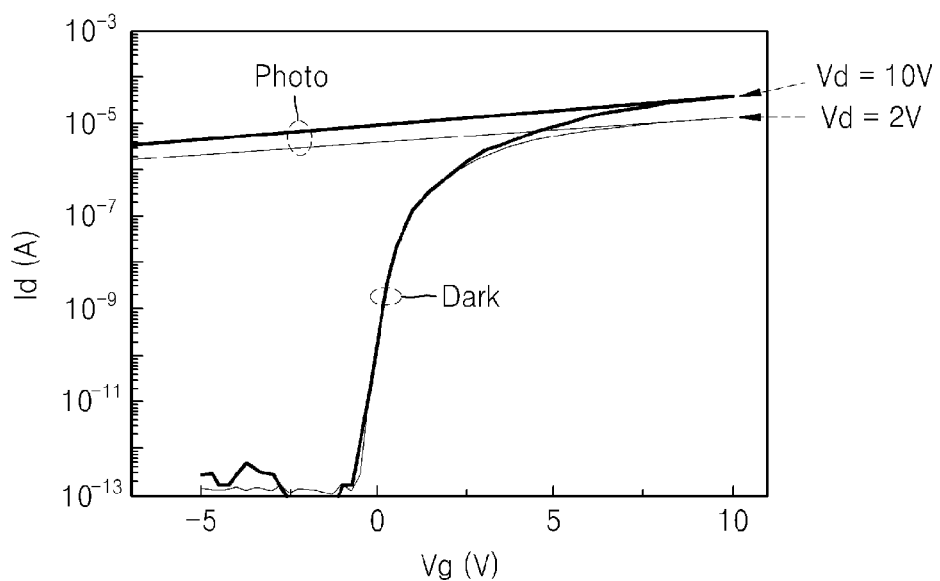
FIG. 10 is a graph showing a result of measuring the photosensitivity of a first transistor of FIG. 9H.

FIG. 10 is a graph showing a result of measuring the photosensitivity of the first transistor Tr10 of FIG. 9H. In the measurement, a GaInZnO layer, a $SiO_2$ layer, and an InZnO layer were respectively used as the first oxide semiconductor layer 11, the insulating layer 22, and the second oxide semiconductor layer 33 included in the first active layer A10. Thicknesses of the GaInZnO layer, the $SiO_2$ layer, and the InZnO layer were respectively about 20 nm, about 100 nm, and about 40 nm. In FIG. 10, 'Dark' denotes a case where light is not irradiated on the first transistor Tr10 and 'Photo' denotes a case where light of about 10,000 nit is irradiated on the first transistor Tr10. The graph of FIG. 10 shows a case where a drain voltage Vd is about 2 V and a case where a drain voltage Vd is about 10 V.

Referring to FIG. 10, the gate voltage (Vg)-drain current (Id) graph when light is not irradiated ('Dark') is obviously different from the case when light is irradiated ('Photo'). An off-current level when light is irradiated ('Photo') is far greater than when light is not irradiated ('Dark'). That is, in a left part of the graph of FIG. 10 with respect to about 0 V, a graph level (current level) when light is irradiated ('Photo') is far higher than a graph level (current level) when light is irradiated ('Dark'). Current $I_{Photo}$ when light is irradiated is higher than about $10^{-6}$ A. A ratio between the current $I_{Photo}$ when light is irradiated and current $I_{Dark}$ when light is not irradiated, i.e., $I_{Photo}/I_{Dark}$, is about $10^7$ or higher. The measurement reveals that the photosensitivity of a transistor according to an example embodiment is relatively high. $I_{Photo}/I_{Dark}$ when the drain voltage Vd is about 10 V is higher than when the drain voltage Vd is about 2 V.

Figure 11:
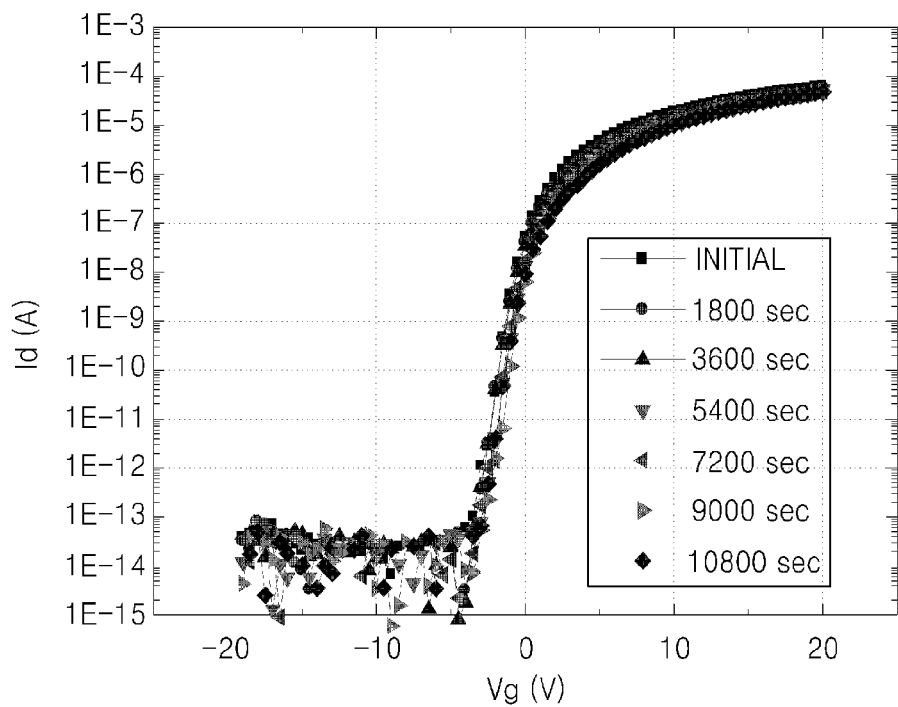
FIG. 11 is a graph showing a result of measuring the photosensitivity of a second transistor of FIG. 9H.

FIG. 11 is a graph showing a result of measuring the photosensitivity of the second transistor Tr20 of FIG. 9H. More specifically, the graph of FIG. 11 shows a result of measuring a variation in the gate voltage (Vg)-drain current (Id) characteristics according to the time that light is irradiated, while light of about 10,000 nit is irradiated on the second transistor Tr20. In the measurement, a GaInZnO layer was used as the second active layer A20 of the second transistor Tr20 and the drain voltage Vd was about 10V.

Referring to FIG. 11, the Vg-Id graph hardly changes even when the time that light is irradiated increases. This means that the photosensitivity of the second transistor Tr20 is relatively low. The second transistor Tr20 is used not as a photo sensor but as a switching transistor. Thus, a second transistor Tr20 may be desirable with lower photosensitivity. The measurement reveals that the second transistor Tr20 of FIG. 9H is suitable to be used as a switching transistor.

Figure 12:
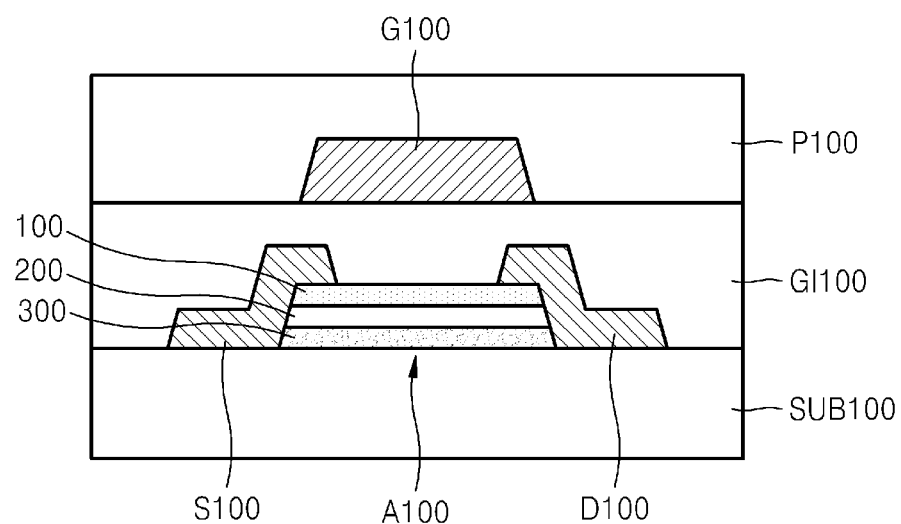
FIGS. 12 and 13 are cross-sectional views illustrating transistors according to other example embodiments.
Figure 13:
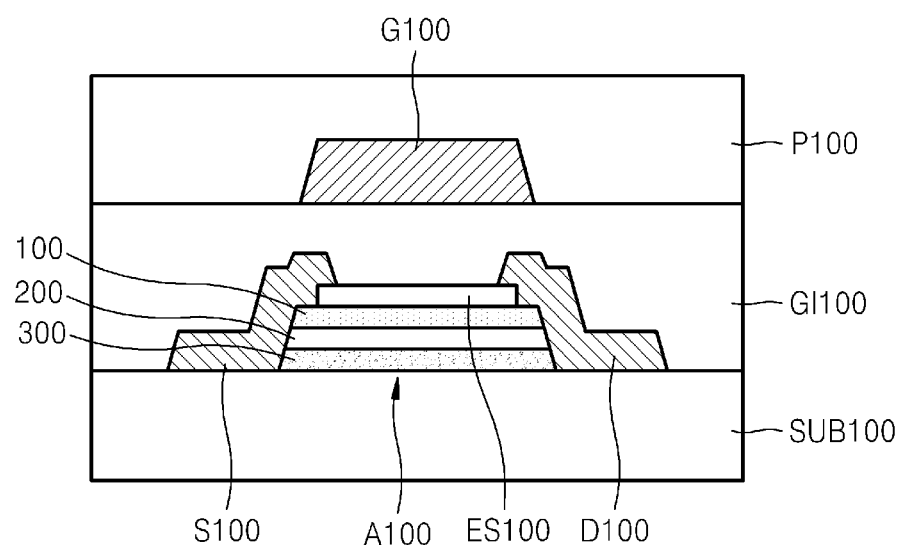

A bottom-gate type transistor and an electronic device including the same have been described above but aspects of example embodiments may also be applied to a top-gate type transistor, examples of which are shown in FIGS. 12 to 15. FIG. 12 is a cross-sectional view of a top-gate type transistor formed by modifying the transistor of FIG. 1, according to another example embodiment. FIG. 13 is a cross-sectional view of a top-gate type transistor formed by modifying the transistor of FIG. 3, according to another example embodiment.

Figure 14:
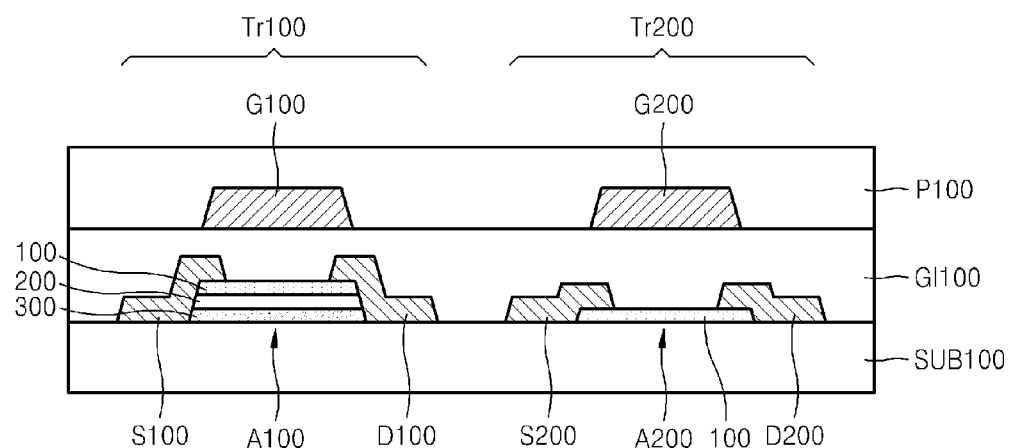
FIGS. 14 and 15 are cross-sectional views illustrating electronic devices (photo-sensing circuits) which include transistors, according to other example embodiments.
Figure 15:
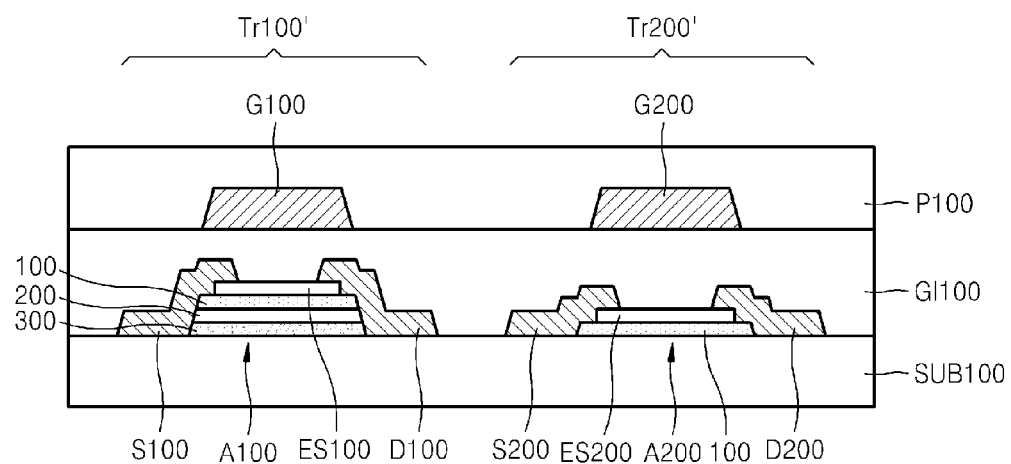

FIG. 14 is a cross-sectional view of an electronic device including a top-gate type transistor formed by modifying the transistor of the electronic device of FIG. 5, according to another example embodiment. FIG. 15 is a cross-sectional view of an electronic device including a top-gate type transistor formed by modifying the photo-sensing circuit including the photo sensor transistor Tr1' and the switching transistor Tr2' of the electronic device of FIG. 8, according to another example embodiment.

Referring to FIG. 12, an active layer A100 may be disposed on a portion of a substrate SUB100. The active layer A100 may include a second oxide semiconductor layer 300, an insulating layer 200, and a first oxide semiconductor layer 100 that are sequentially stacked. Materials of the first oxide semiconductor layer 100, the insulating layer 200, and the second oxide semiconductor layer 300 may respectively correspond to those of the first oxide semiconductor layer 10, the insulating layer 20, and the second oxide semiconductor layer 30 of FIG. 1. The active layer A100 has a structure similar to a result of reversing the active layer A1 of FIG. 1, i.e., a reversed structure.

A source electrode S100 and a drain electrode D100 may be disposed to contact both ends of the active layer A100. A gate insulating layer GI100 may be disposed on the substrate SUB100 to cover the active layer A100, the source electrode S100, and the drain electrode D100. A gate G100 may be disposed on the gate insulating layer GI100 above the active layer A100. A passivation layer P100 may be disposed on the gate insulating layer GI100 to cover the gate G100. Materials of the source electrode S100, the drain electrode D100, the gate insulating layer GI100, the gate G100, and the passivation layer P100 may be substantially the same as or similar to those of the source electrode S1, the drain electrode D1, the gate insulating layer GI1, the gate G1, and the passivation layer P1 of FIG. 1.

The transistor of FIG. 12 uses the active layer A100, including a plurality of oxide semiconductor layers, namely the first and second oxide semiconductor layers 100 and 300, similar to the transistor of FIG. 1. Thus, operating characteristics, e.g., a threshold voltage, of the transistor may be appropriately controlled and the photosensitivity of the transistor may be improved. If such a transistor is used, an electronic device having improved operating and photo sensing characteristics, e.g., a photo-sensing device, may be manufactured. The transistor of FIG. 12 may further include an etch stop layer disposed on the active layer A100, as illustrated in FIG. 13.

Referring to FIG. 13, an etch stop layer ES100 may further be disposed on the active layer A100, compared to the transistor of FIG. 12. A shape and material of the etch stop layer ES100 may be substantially the same as or similar to those of the etch stop layer ES1 of FIG. 3. The structure of the transistor of FIG. 13 may be the same as that of the transistor of FIG. 12, except for the etch stop layer ES100.

FIG. 14 is a cross-sectional view illustrating the electronic device (photo-sensing circuit) which includes a transistor, according to another example embodiment. Referring to FIG. 14, the electronic device (photo-sensing circuit) may include a photo sensor transistor Tr100 and a switching transistor Tr200. A structure of the photo sensor transistor Tr100 may be substantially the same as or similar to that of the transistor of FIG. 12. More specifically, the photo sensor transistor Tr100 may include a first gate G100, a gate insulating layer GI100, a first active layer A100, a first source electrode S100, and a first drain electrode D100. The first active layer A100 may include a first oxide semiconductor layer 100, an insulating layer 200, and a second oxide semiconductor layer 300.

The first gate G100, the gate insulating layer GI100, the first active layer A100, the first source electrode S100, and the first drain electrode D100 may be respectively the same as the gate G100, the gate insulating layer GI100, the active layer A100, the source electrode S100, and the drain electrode D100 of FIG. 12. The switching transistor Tr200 may have a different structure from that of the photo sensor transistor Tr100. An active layer A200 (hereinafter referred to as the 'second active layer A200') of the switching transistor Tr200 may have a different structure from that of the first active layer A100 of the photo sensor transistor Tr100.

For example, the second active layer A200 may be formed of a material used to form the first oxide semiconductor layer 100 of the first active layer A100. The second active layer A200 may have a single-layered structure but may have a multi-layered structure in some cases. The switching transistor Tr200 performs switching other than optical sensing and thus does not use a photo sensor layer, i.e., the second oxide semiconductor layer 300. Thus, the characteristics of the switching transistor Tr200 are hardly affected by light. Materials and structures of a second gate G200, the gate insulating layer GI100, a second source electrode S200, and a second drain electrode D200 may respectively be substantially the same as or similar to those of the first gate G100, the gate insulating layer GI100, the first source electrode S100, and the first drain electrode D100.

A first etch stop layer and a second etch stop layer may further be disposed on the first active layer A100 and the second active layer A200 of FIG. 14, as illustrated in FIG. 15. In the electronic device of FIG. 15, a first etch stop layer ES100 may be disposed on the first active layer A100, and a second etch stop layer ES200 may be disposed on the second active layer A200. The other components of the electronic device of FIG. 15 may be substantially the same as those of the electronic device of FIG. 14.

The electronic devices of FIGS. 14 and 15 may be photo-sensing circuits, and may have a circuit structure similar to that of the electronic device of FIG. 7. The photo-sensing circuits of FIGS. 14 and 15 may be used in various electronic devices, e.g., a flat panel display device. If the photo-sensing circuit of FIG. 14 or 15 is used in a flat panel display device, a switch for display, which is included in the flat panel display device, may have the same structure as the switching transistor Tr200 or Tr200' of FIG. 14 or 15.

Figure 16A:
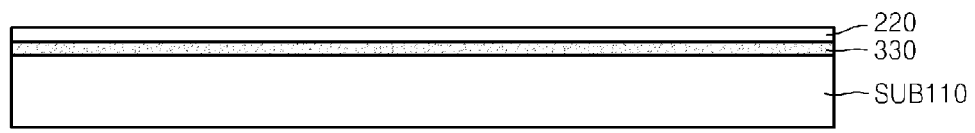
FIGS. 16A to 16H are cross-sectional views illustrating a method of manufacturing an electronic device (photo-sensing circuit) which includes a transistor, according to another example embodiment.

FIGS. 16A to 16H are cross-sectional views illustrating a method of manufacturing an electronic device (photo-sensing circuit) which includes a transistor, according to another example embodiment. Referring to FIG. 16A, a second oxide semiconductor layer 330 and an insulating layer 220 may be formed on a substrate SUB110. Materials of the second oxide semiconductor layer 330 and the insulating layer 220 may respectively correspond to those of the second oxide semiconductor layer 30 and the insulating layer 20 of FIG. 12.

Figure 16B:
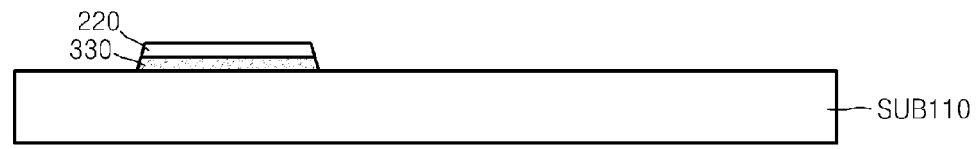

The second oxide semiconductor layer 330 and the insulating layer 220 may be patterned to form a stack structure as illustrated in FIG. 16B. Referring to FIG. 16B, the stack structure of the patterned second oxide semiconductor layer 330 and insulating layer 220 is obtained.

Figure 16C:
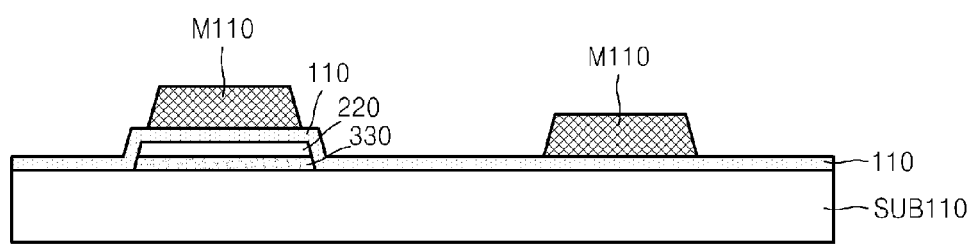

Referring to FIG. 16C, a first oxide semiconductor layer 110 may be formed on the substrate SUB110 to cover the stack structure of the patterned second oxide semiconductor layer 330 and insulating layer 220. The first oxide semiconductor layer 110 may be formed of a material used to form the first oxide semiconductor layer 100 of FIG. 12. A predetermined or given first mask pattern M110 may be formed on portions of the first oxide semiconductor layer 110. The first mask pattern M110 may have a shape that defines first and second active regions.

Figure 16D:
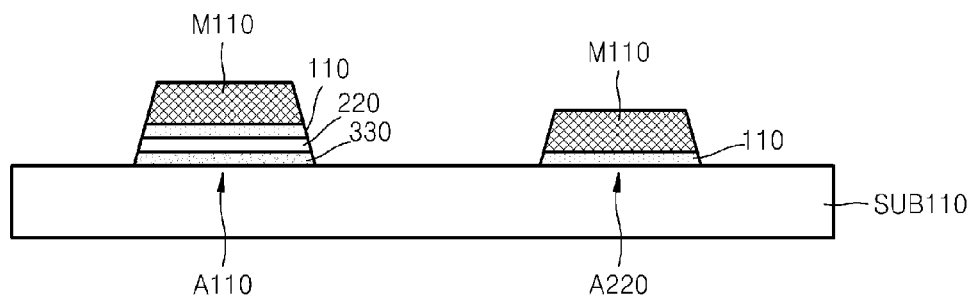

The first oxide semiconductor layer 110 may be etched using the first mask pattern M110 as an etch barrier. The resultant structure is illustrated in FIG. 16D. Referring to FIG. 16D, a first active layer A110, including the patterned second oxide semiconductor layer 330 and insulating layer 220 and first oxide semiconductor layer 110, may be formed. A second active layer A220, including the patterned first oxide semiconductor layer 110, may be formed apart from the first active layer A110.

Figure 16E:
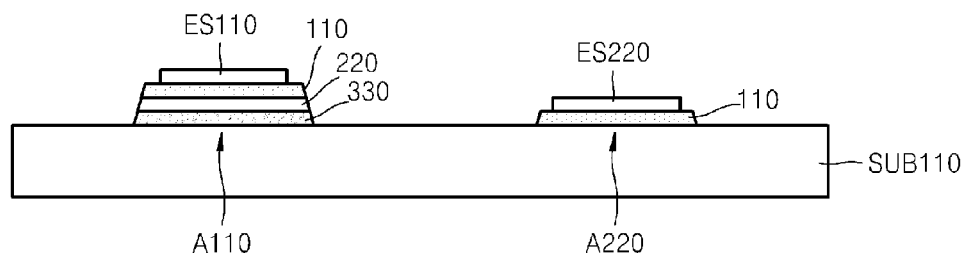

Referring to FIG. 16E, the first mask pattern M110 is removed, and a first etch stop layer ES110 and a second etch stop layer ES220 may be respectively formed on the first and second active layers A110 and A220.

Figure 16F:
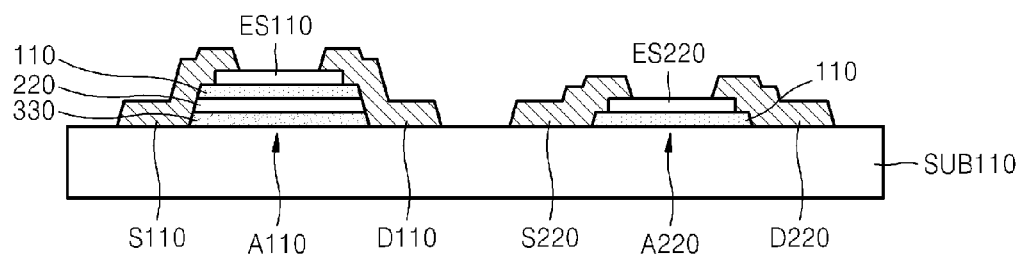

Referring to FIG. 16F, a first source electrode S110 and a first drain electrode D110 may be formed to contact both ends of the first active layer A110, and a second source electrode S220 and a second drain electrode D220 may be formed to contact both ends of the second active layer A220. The first source electrode S110 and the first drain electrode D110 may cover both ends of the first etch stop layer ES110, and the second source electrode S220 and the second drain electrode D220 may cover both ends of the second etch stop layer ES220.

Figure 16G:
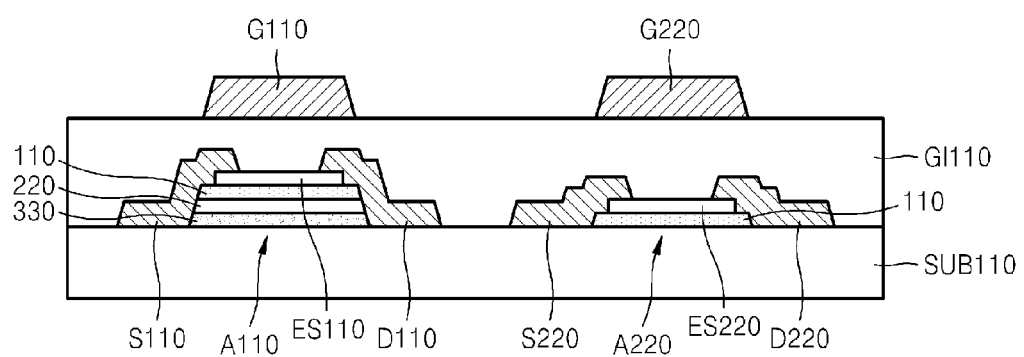

Referring to FIG. 16G, a gate insulating layer GI110 may be formed on the substrate SUB110 to cover the first and second active layers A110 and A220, the first and second source electrodes S110 and S220, and the first and second drain electrodes D110 and D220. First and second gates G110 and G220 may be formed on portions of the gate insulating layer GI110. The first gate G110 may be formed above the first active layer A110, and the second gate G220 may be formed above the second active layer A220.

Figure 16H:
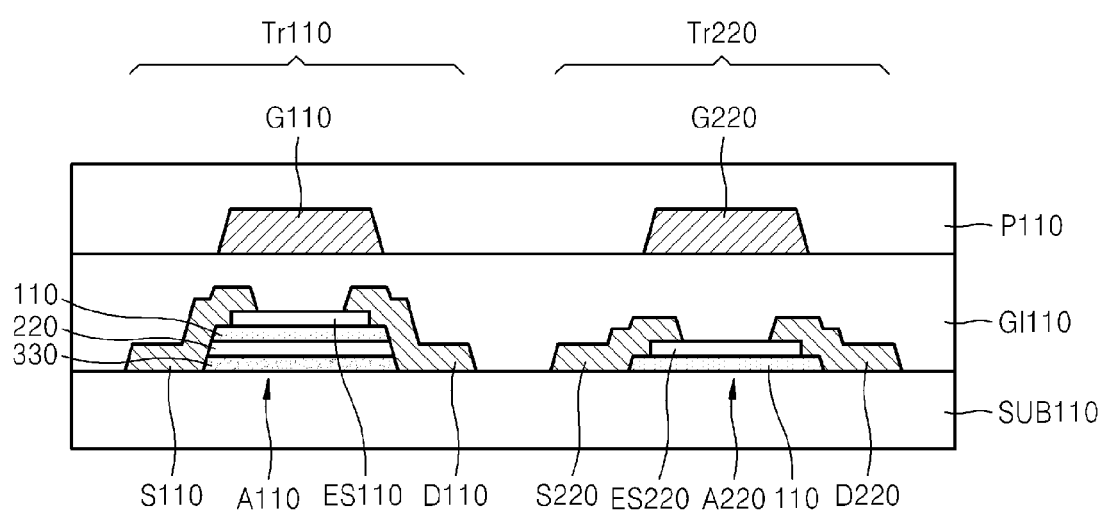

Referring to FIG. 16H, a passivation layer P110 may be formed on the gate insulating layer GI110 to cover the first gate G110 and the second gate G220. The passivation layer P110 may be a silicon oxide layer, a silicon oxynitride layer, a silicon nitride layer, or an organic insulating layer, or may have a stack structure including at least two layers from among these layers. The first active layer A110, the first etch stop layer ES110, the first source electrode S110, the first drain electrode D110, the gate insulating layer GI110, and the first gate G110 may constitute a first transistor Tr110. The second active layer A220, the second etch stop layer ES220, the second source electrode S220, the second drain electrode D220, the gate insulating layer GI110, and the second gate G220 may constitute a second transistor Tr220. The two transistors, namely, the first and second transistors Tr110 and Tr220, may be annealed at a predetermined or given temperature.

The electronic device manufactured according to the method of FIGS. 16A to 16H may be, for example, a photo-sensing circuit. In this case, the first transistor Tr100 may be a photo sensor transistor and the second transistor Tr220 may be a switching transistor. A display unit may be formed together with the photo-sensing circuit. A switch of the display unit may have substantially the same structure as or similar structure to that of the second transistor Tr220. A flat panel display device including the photo-sensing circuit may be manufactured by forming the display unit together with the photo-sensing circuit.

It should be understood that example embodiments described herein should be considered in a descriptive sense only and not for purposes of limitation. For example, it would be obvious to those of ordinary skill in the art that various modifications may be made to the transistors of FIGS. 1 to 3, 12, and 13. Specifically, in the transistors of FIGS. 1 to 3, 12, and 13, at least one of the first oxide semiconductor layers 10, 10', and 100 and the second oxide semiconductor layers 30 and 300 may have a multi-layered structure. Also, a transistor according to an example embodiment may have a double-gate type structure. The electronic devices of FIGS. 5, 7, 8, 14, and 15 may be applied to electronic devices other than a photo-sensing circuit and a flat panel display device, for various purposes. Various modifications may also be made to the method of FIGS. 9A to 9H and the method of FIGS. 16A to 16H. In addition, it would be obvious to those of ordinary skill in the art that the inventive concepts may be applied to not only an oxide thin-film transistor but to other transistors.

It should be understood that example embodiments described herein should be considered in a descriptive sense only and not for purposes of limitation. Descriptions of features or aspects within each embodiment should typically be considered as available for other similar features or aspects in other embodiments.

What is claimed is:

1. A transistor comprising:
    an active layer including a first oxide semiconductor layer, a second oxide semiconductor layer, and an insulating layer disposed between the first and second oxide semiconductor layers;
    a source contacting one end of the active layer and a drain contacting another end of the active layer;
    a gate corresponding to the active layer; and
    a gate insulating layer disposed between the active layer and the gate,
    wherein the first oxide semiconductor layer and the second oxide semiconductor layer include different material.

2. The transistor of claim 1, wherein the insulating layer includes a material that has an etch selectivity with respect to at least one of the first and second oxide semiconductor layers that is equal to or greater than about '2'.

3. The transistor of claim 1, wherein the insulating layer includes silicon.

4. The transistor of claim 1, wherein the insulating layer includes at least one of silicon oxide, silicon oxynitride and silicon nitride.

5. The transistor of claim 1, wherein the first oxide semiconductor layer, the insulating layer, and the second oxide semiconductor layer are sequentially disposed on a surface of the gate.

6. The transistor of claim 5, wherein the second oxide semiconductor layer includes a material that has higher photosensitivity than the first oxide semiconductor layer.

7. The transistor of claim 5, wherein the second oxide semiconductor layer includes a material that has a narrower energy band gap than the first oxide semiconductor layer.

8. The transistor of claim 5, wherein the first oxide semiconductor layer includes at least one selected from a group consisting of MInZnO, MZnO, MAlO, and MSnO, where M denotes a metal element.

9. The transistor of claim 5, wherein the second oxide semiconductor layer includes at least one selected from a group consisting of InZnO, InO, and ZnO.

10. The transistor of claim 8, wherein the metal element (M) is one of gallium (Ga), hafnium (Hf), titanium (Ti), tantalum (Ta), zirconium (Zr), and lanthanide (Ln).

11. The transistor of claim 8, wherein the first oxide semiconductor layer is one of a GaInZnO layer and a HfInZnO layer.

12. The transistor of claim 9, wherein the second oxide semiconductor layer is an InZnO layer.

13. The transistor of claim 1, further comprising:
an etch stop layer on the active layer.

14. The transistor of claim 1, wherein the active layer is disposed on the gate.

15. The transistor of claim 1, wherein the gate is disposed on the active layer.

16. A photo-sensing circuit comprising the transistor of claim 1.

17. The photo-sensing circuit of claim 16, wherein the transistor is a photo sensor transistor.

18. The photo-sensing circuit of claim 17, further comprising:
a switching transistor connected to the photo sensor transistor.

19. The photo-sensing circuit of claim 18 wherein the switching transistor includes an active layer having a single-layered structure.

20. The photo-sensing circuit of claim 19, wherein the active layer of the switching transistor is formed of a material that is the same as the first oxide semiconductor layer of the photo sensor transistor.

21. An electronic device comprising the photo-sensing circuit of claim 16.

22. An electronic device comprising:
a first transistor including a first active layer, a first gate, a first source, and a first drain, the first active layer including a first oxide semiconductor layer, a second oxide semiconductor layer, and an insulating layer therebetween; and
a second transistor connected to the first transistor, the second transistor including a second active layer having a different structure from the first active layer, a second gate, a second source, and a second drain,
wherein the first oxide semiconductor layer and the second oxide semiconductor layer include different materials.

23. The electronic device of claim 22, wherein the insulating layer includes silicon.

24. The electronic device of claim 22, wherein the second oxide semiconductor layer includes a material that has higher photosensitivity than the first oxide semiconductor layer.

25. The electronic device of claim 22, wherein the first oxide semiconductor layer includes at least one selected from a group consisting of MInZnO, MZnO, MAlO, and MSnO, where M is one of gallium (Ga), hafnium (Hf), titanium (Ti), tantalum (Ta), zirconium (Zr), and lanthanide (Ln).

26. The electronic device of claim 22, wherein the second oxide semiconductor layer includes at least one selected from a group consisting of InZnO, InO, and ZnO.

27. The electronic device of claim 22, wherein the second active layer has a single-layered structure.

28. The electronic device of claim 22, wherein the second active layer is formed of a material that is the same as the first oxide semiconductor layer.

29. The electronic device of claim 22, wherein the first and second transistors constitute a photo-sensing circuit.

30. The electronic device of claim 29, wherein the first transistor is a photo sensor transistor, and the second transistor is a switching transistor.

31. A method of manufacturing an electronic device, the method comprising:
forming a first gate and a second gate on a substrate;
forming a gate insulating layer covering the first and second gates;
sequentially forming a first oxide semiconductor layer, an insulating layer, and a second oxide semiconductor layer on the gate insulating layer, the first oxide semiconductor layer and the second oxide semiconductor layer including different materials;
forming a first mask layer on the second oxide semiconductor layer on the first gate;
etching the second oxide semiconductor layer and the insulating layer using the first mask layer to define a first active region including the first oxide semiconductor layer, the insulating layer, and the second oxide semiconductor layer on the first gate, and a second active region including the first oxide semiconductor layer on the second gate;
removing the first mask layer; and
forming a first source and a first drain contacting the first active region, and forming a second source and a second drain contacting the second active region.

32. The method of claim 31, wherein the insulating layer includes a material that has an etch selectivity with respect to the first oxide semiconductor layer that is equal to or greater than about '2'.

33. The method of claim 31, wherein, the insulating layer includes silicon.

34. The method of claim 31, wherein the second oxide semiconductor layer includes a material that has higher photosensitivity than the first oxide semiconductor layer.

35. The method of claim 31, wherein the first oxide semiconductor layer comprises at least one selected from a group consisting of MInZnO, MZnO, MAlO, and MSnO, where M is one of gallium (Ga), hafnium (Hf), titanium (Ti), tantalum (Ta), zirconium (Zr), and lanthanide (Ln).

36. The method of claim 31, wherein the second oxide semiconductor layer comprises at least one selected from a group consisting of InZnO, InO, and ZnO.

37. The method of claim 31, further comprising:
forming a first etch stop layer on the first active region and a second etch stop layer on the second active region.

38. The method of claim 37, wherein the forming the first source and the first drain contacting the first active region, and the forming the second source and the second drain contacting the second active region comprises:
forming an electrode layer covering the first and second etch stop layers;
forming a second mask pattern on the electrode layer;
etching the electrode layer and the first oxide semiconductor layer using the second mask pattern; and
removing the second mask pattern.

39. The method of claim 31, wherein the first gate, the first active region, the first source, and the first drain constitute a photo sensor transistor, and the second gate, the second active region, the second source, and the second drain constitute a switching transistor.

40. A method of manufacturing an electronic device comprising:
  forming a second oxide semiconductor layer and an insulating layer on a substrate;
  forming a first oxide semiconductor layer covering the second oxide semiconductor layer and the insulating layer;
  forming a first mask layer on portions of the first oxide semiconductor layer;
  etching the first oxide semiconductor layer using the first mask layer to form a first active layer including the second oxide semiconductor layer, the insulating layer and the first oxide semiconductor layer, and a second active layer apart from the first active layer, the second active layer including the first oxide semiconductor layer;
  removing the first mask layer;
  forming a first source contacting one end of the first active layer and a first drain contacting another end of the first active layer, and forming a second source contacting one end of the second active layer and a second drain contacting another end of the second active layer;
  forming a gate insulating layer coveting exposed surfaces of the first and second active layers, the first source and drain, and the second source and drain; and
  forming a first gate and a second gate on the gate insulating layer, the first gate corresponding with the first active layer and the second gate corresponding with the second active layer, respectively,
  wherein the first oxide semiconductor layer and the second oxide semiconductor layer include different materials.

41. The method of claim 40, wherein the first gate, the first active region, the first source, and the first drain constitute a photo sensor transistor, and
  the second gate, the second active region, the second source, and the second drain constitute a switching transistor.

42. An active layer for a transistor comprising:
  a first oxide semiconductor layer, a second oxide semiconductor layer, and an insulating layer disposed between the first and second oxide semiconductor layers,
  the insulating layer including a material that has an etch selectivity with respect to at least one of the first and second oxide semiconductor layers that is equal to or greater than about '2',
  wherein the first oxide semiconductor layer and the second oxide semiconductor layer include different material.

43. The active layer of claim 42, wherein the insulating layer includes silicon.

44. The active layer of claim 42, wherein the first oxide semiconductor layer is one of a GaInZnO layer and a HfInZnO layer.

45. The active layer of claim 42, wherein the second oxide semiconductor layer includes at least one selected from a group consisting of InZnO, InO, and ZnO.

* * * * *